United States Patent
Ganivet et al.

(10) Patent No.: US 6,812,747 B2
(45) Date of Patent: Nov. 2, 2004

(54) SUPPLY VOLTAGE COMPARATOR

(75) Inventors: Filipe Ganivet, Venelles (FR); Francesco La Rosa, Rousset (FR); Thierry Giovinazzi, Aix en Provence (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/420,342

(22) Filed: Apr. 22, 2003

(65) Prior Publication Data

US 2004/0032243 A1 Feb. 19, 2004

(30) Foreign Application Priority Data

Apr. 23, 2002 (FR) .......................................... 02 05042

(51) Int. Cl.⁷ ............................................... H03K 5/22
(52) U.S. Cl. ........................................ 327/66; 327/589
(58) Field of Search ............................ 323/315; 327/53, 327/56, 58–63, 66, 68–72, 81–82, 90, 536–543, 546, 589

(56) References Cited

U.S. PATENT DOCUMENTS

| | | | |
|---|---|---|---|
| 5,420,499 A | * 5/1995 | DeShazo | 323/315 |
| 5,780,904 A | 7/1998 | Konishi et al. | 257/369 |
| 5,841,725 A | 11/1998 | Kang et al. | 365/226 |
| 5,990,671 A | 11/1999 | Nagata | 323/313 |
| 6,133,764 A | * 10/2000 | Griffith et al. | 327/65 |
| 6,163,175 A | * 12/2000 | Sharpe-Geisler | 327/77 |
| 6,353,350 B1 | * 3/2002 | Bedarida et al. | 327/291 |
| 6,639,452 B2 | * 10/2003 | Ono et al. | 327/541 |

FOREIGN PATENT DOCUMENTS

| EP | 0525679 | 2/1993 | G11C/16/06 |
|---|---|---|---|
| EP | 0718740 | 6/1996 | G05F/1/46 |
| EP | 0905710 | 3/1999 | G11C/16/06 |

* cited by examiner

*Primary Examiner*—My-Trang Nuton
(74) *Attorney, Agent, or Firm*—Lisa K. Jorgenson; Allen, Dyer, Doppelt, Milbrath & Gilchrist, P.A.

(57) ABSTRACT

A comparator compares a first voltage applied to a first input to a second voltage applied to a second input. The comparator delivers an output signal having a first value when the second voltage is higher than the first voltage, and having a second value when the second voltage is lower than the first voltage. The comparator includes first and second PMOS transistors arranged as current mirrors. The first PMOS transistor has its source connected to the first input of the comparator for receiving the first voltage. The second PMOS transistor has its source connected to the second input of the comparator for receiving the second voltage. The output of the comparator is connected to the drain of one of the transistors.

31 Claims, 4 Drawing Sheets

SUPPLY VOLTAGE COMPARATOR

FIELD OF THE INVENTION

The present invention relates to a comparator that compares a first voltage applied to a first input to a second voltage applied to a second input, and delivers an output signal having a first value when the second voltage is higher than the first voltage and having a second value when the second voltage is lower than the first voltage.

BACKGROUND OF THE INVENTION

Figure 1:
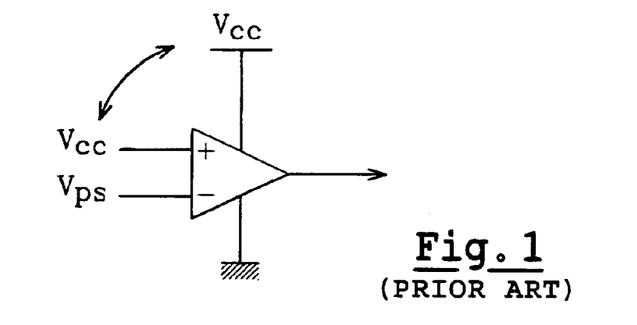
FIG. 1 illustrates a comparison operation that cannot be performed with a prior art comparator.

In certain applications, it may prove necessary to compare a supply voltage with a determined voltage. This comparison cannot be carried out with a prior art comparator having two inputs and one power supply input. The resulting arrangement is schematically represented in FIG. 1.

The prior art comparator represented in this figure receives a supply voltage at its supply terminal and one of its inputs, for example, its positive input. It receives at its other input, here the negative input, a voltage Vps to be compared to the voltage Vcc. It will be understood by those skilled in the art that this arrangement cannot operate since the differential stages of the comparator cannot be biased by the same voltage as one of the voltages to be compared.

SUMMARY OF THE INVENTION

In view of the foregoing background, an object of the present invention is to provide a comparator that allows two voltages to be compared, wherein at least one of the voltage is a supply voltage of the comparator.

The present invention advantageously provides a comparator allowing two voltages to be compared without requiring a third voltage distinct from the two voltages to be compared.

Another object of the present invention is to use this comparator to manage the supply voltage of an integrated circuit.

Figure 2:
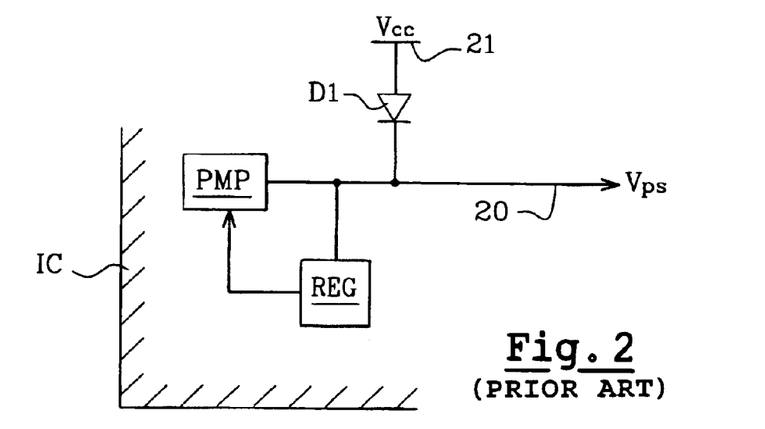
FIG. 2 illustrates a power supply management system according to the prior art.

FIG. 2 schematically represents a prior art power supply management system. An integrated circuit IC comprising a distribution line 20 of an internal supply voltage Vps and a receiving terminal 21 of an external supply voltage Vcc can be distinguished. The line 20 is linked to the terminal 21 through a diode D1 biased in the forward direction. The line 20 is also linked to the output of a booster circuit, such as a charge pump PMP, for example, controlled by a regulator REG. The regulator activates the charge pump PMP when the voltage Vps becomes lower than a threshold Vmin, so as to maintain the latter proximate to this threshold. The charge pump is therefore activated when the voltage Vcc is lower than Vmin+Vd. Vd is the voltage drop at the terminals of the diode (threshold voltage of the diode), which is typically on the order of 0.7 to 1 V according to the technology used.

Since the consumption of a charge pump, and generally speaking that of a booster circuit, are significant, it is desirable to delay the moment when the charge pump is activated by removing the diode voltage Vd. If the diode voltage Vd is zero, the voltage Vcc ensures the power supply of the line 20 until the voltage Vcc becomes lower than Vmin. In this case, the charge pump remains deactivated in the range of values (Vmin, Vmin+Vd) of the voltage Vcc.

Thus, another aspect of the present invention is to provide a management system of the supply voltage of an integrated circuit using a comparator to compare the internal supply voltage and the external supply voltage of the integrated circuit.

This and other objects, advantages and features in accordance with the present invention are provided by a comparator arranged to compare a first voltage applied to a first input of the comparator and a second voltage applied to a second input of the comparator, and to deliver to one output of the comparator an output signal having a first value when the second voltage is higher than the first voltage and having a second value when the second voltage is lower than the first voltage.

The comparator comprises first and second PMOS transistors arranged as current mirrors. The first PMOS transistor has its source connected to the first input of the comparator to receive the first voltage. The second PMOS transistor has its source connected to the second input of the comparator to receive the second voltage. The output of the comparator is connected to the drain of one of the transistors.

The gates of the first and the second transistors may be interconnected. A transistor may have its gate linked to its drain, and the output of the comparator is linked to the drain of the other transistor. The bulk of the first PMOS transistor may be linked to the source of the first transistor to receive the first voltage, and the bulk of the second PMOS transistor is may be linked to the source of the second transistor to receive the second voltage. The PMOS transistors may have gates of the same dimension.

The comparator may comprise a first branch comprising the first PMOS transistor in series with a first source of current, and a second branch comprising the second PMOS transistor in series with a second source of current. The sources of current provide substantially equal or proportional currents in the first and second branches.

The first branch may further comprise the first PMOS transistor in series with a first NMOS transistor. The second branch may further comprise the second PMOS transistor in series with a second NMOS transistor. The drain of the first PMOS transistor may be linked to the drain of the first NMOS transistor. The drain of the second PMOS transistor may be linked to the drain of the second NMOS transistor. The gates of the first and second NMOS transistors may be linked to the output of a reference voltage generator providing substantially equal or proportional currents in each of the branches.

The present invention also relates to an integrated circuit comprising a comparator according to the present invention arranged to compare an external supply voltage of the integrated circuit and an internal supply voltage of the integrated circuit.

The integrated circuit may comprise a distribution line of the internal supply voltage linked to a booster circuit and to a receiving terminal of the external supply voltage through a power switch driven by the output signal of the comparator.

The integrated circuit may also comprise means for triggering the booster circuit when the internal supply voltage is lower than a determined threshold, so as to maintain the internal supply voltage proximate to the threshold when the external supply voltage is too low. The power switch may be blocked by the comparator when the booster circuit is active.

The power switch may be a PMOS transistor receiving the output signal of the comparator at its gate. The booster circuit may be a charge pump. The integrated circuit may comprise a memory array comprising electrically erasable and programmable memory cells, and at least one line decoder having a supply terminal connected to the distribution line of the internal supply voltage.

The determined threshold is higher than or equal to the sum of a memory cell read voltage and a MOS transistor threshold voltage. The integrated circuit comprises a single booster circuit and a regulator with two modes of operation. One operation, during phases of erasing or programming memory cells, takes the internal supply voltage to a high erasing or programming voltage. A second operation, at least during phases of reading memory cells, maintains the internal supply voltage proximate to the determined threshold when the external supply voltage is too low.

BRIEF DESCRIPTION OF THE DRAWINGS

These and other objects, advantages and features of the present invention shall be explained in greater detail in the following description of a comparator according to the present invention, of a power supply management system using a comparator according to the present invention, and of an electrically erasable and programmable memory comprising a power supply management system according to the present invention, given in relation with, but not limited to the following figures.

DETAILED DESCRIPTION OF THE PREFERRED EMBODIMENTS

Figure 3:
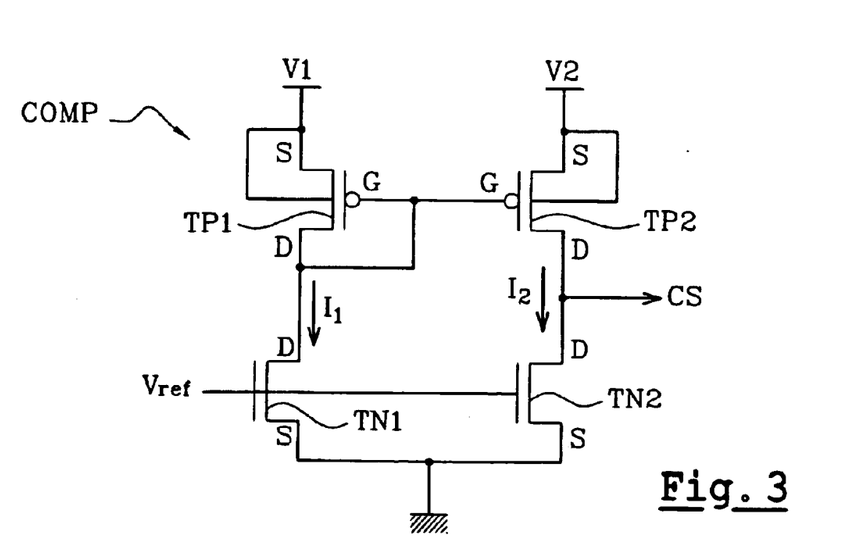
FIG. 3 is a diagram of one embodiment of a comparator according to the present invention.

A description of a comparator according to the present invention will now be discussed. FIG. 3 is a diagram of one embodiment of a comparator COMP according to the present invention. The comparator is provided to compare a voltage V1 and a voltage V2, and to deliver an output signal CS set to 1 when one of the voltages is higher than the other, or set to 0 in the opposite case.

The comparator COMP comprises two PMOS transistors TP1, TP2 having their gates G interconnected. The source S of the transistor TP1 forms the first input of the comparator and receives the voltage V1. The source S of the transistor TP2 forms the second input of the comparator and receives the voltage V2. The bulk of the transistor TP1 is taken to the source potential of the transistor, and therefore receives the voltage V1. The bulk of the transistor TP2 is also taken to the source potential of the transistor, and therefore receives the voltage V2. The output of the comparator, which delivers the signal CS, is connected to the drain of the transistor TP2.

The transistors TP1, TP2 are in two branches arranged as current mirrors. The first branch comprises the transistor TP1 in series with a transistor TN1, and the second branch comprises the transistor TP2 in series with a transistor TN2. The transistor TP1 has its gate G connected to its drain D, which is connected to the drain D of the transistor TN1. The drain of the transistor TP2 is connected to the drain of the transistor TN2. The sources of the transistors TN1, TN2 are linked to ground, and the gates of the transistors TN1 and TN2 are biased by a voltage Vref(I). The voltage Vref(I) is delivered by a reference voltage generator, not represented here, an example embodiment of which will be described below in relation with FIG. 9. The voltage Vref(I) is substantially equal to the threshold voltage of the transistors TN1, TN2 such that the latter operate in a saturated mode and are, as a result, equivalent to current generators.

Preferably, the transistors TP1, TP2 are identical, i.e., having the same W/L ratio (gate width to length ratio). Again preferably, the transistors TN1, TN2 also have the same W/L ratio. Under these conditions, the voltage Vref(I) applied to the gates of the transistors TN1 and TN2 provide equal or substantially equal currents I1, I2 in the two branches. The W/L ratio of the transistors TN1, TN2 is preferably low, for a low current consumption in the branches.

The comparator COMP operates as a differential amplifier comparing the source voltages of the transistors TP1 and TP2, i.e., the voltages V1 and V2. It will be assumed that the voltage V2 is lower than the voltage V1, i.e., V2=V1−ϵ, wherein ϵ is a non-zero quantity. The gate voltage of the transistor TP2 is equal to V1−Vt, since it is imposed by the transistor TP1 that is on. Vt is the threshold voltage of the transistors TP1, TP2. The source-gate voltage Vsg of the transistor TP2 is therefore equal to:

$$Vsg=(V1-\epsilon)-(V1-Vt)=Vt-\epsilon$$

and is therefore substantially lower than Vt, such that the transistor TP2 is blocked. As the transistor TN2 is on, the signal CS changes to 0 (ground).

Conversely, if the voltage V2 is higher than the voltage V1, V1+ϵ for example, the source-gate voltage Vsg of the transistor TP2 is higher than its threshold voltage Vt:

$$Vsg=V1+\epsilon-(V1-Vt)=Vt+\epsilon$$

The transistor TP2 is on and delivers a greater current than the transistor TP1. Since the transistors TN1 and TN2 drain currents are assumed to be identical, the output signal CS rises and becomes equal to the voltage V2, i.e., the logic level 1.

In summary, the transistor TP2 is blocked and the signal CS equal to 0 when the voltage V2 is lower than V1. The transistor TP2 is on and the signal CS is equal to 1 (voltage V2) when the voltage V2 is higher than V1.

In one variation, the arrangement of the current mirror is inverted. The transistor TP2 has its gate connected to its drain, and the gate and the drain of the transistor TP1 are not connected. In this case, an output signal /CS that is the opposite of CS is taken off at the drain of the transistor TP1. The signal /CS is equal to 0 when the voltage V1 is lower than V2 and is equal to 1 (voltage V1) when the voltage V1 is higher than V2.

Furthermore, the pairs of transistors TP1, TP2, respectively TN1, TN2, may have different but proportional gate W/L dimensions. For example, TP2 may have a W/L ratio equal to X times that of TP1. X is higher or lower than 1, and TN2 has a W/L ratio equal to X times that of TN1. In this case, the currents passing through each of the branches are not equal but proportional.

An example of an application of the comparator to a power supply management circuit will now be discussed.

Figure 4:
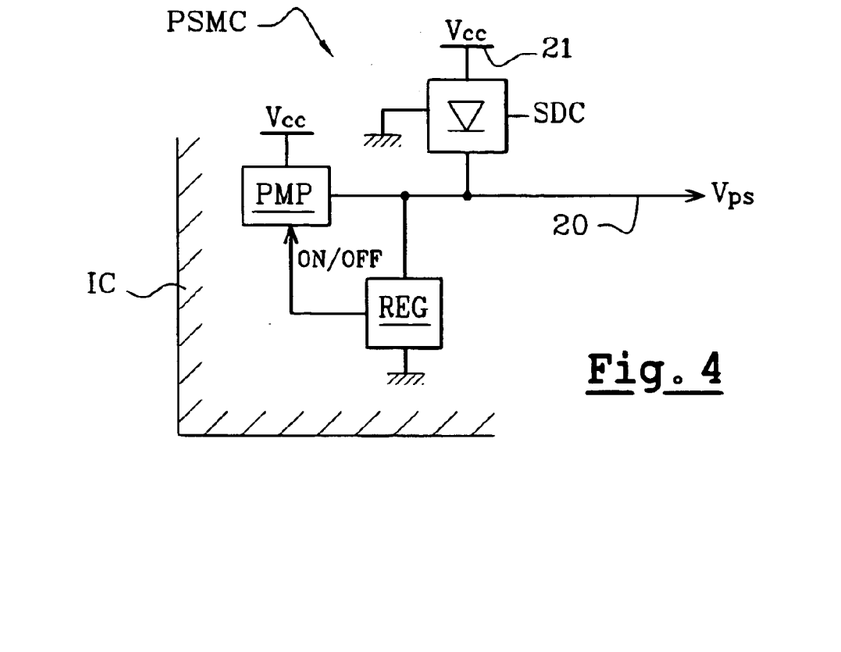
FIG. 4 is the diagram of a first embodiment of a power supply management system according to the present invention.

FIG. 4 represents a circuit PSMC according to the present invention, provided to ensure the management of the supply voltage of an integrated circuit IC. The circuit PSMC comprises a superdiode circuit SDC according to the present invention, which simulates the operation of an ideal diode having a zero threshold voltage. The superdiode circuit has one input or anode connected to a supply terminal 21 of the integrated circuit, which receives an external supply voltage Vcc, and one output or cathode connected to a distribution line 20 of an internal supply voltage Vps. The circuit SDC is in a transmission state when the voltage Vcc is proximate to the voltage Vps by higher values, and is blocked when the voltage Vcc is lower than the voltage Vps.

The circuit PSMC also comprises a booster circuit, here a charge pump PMP, the output of which is connected to the distribution line 20. The charge pump PMP is controlled by a regulator REG that applies a start or stop ON/OFF signal to it. The regulator REG monitors the voltage Vps and activates the charge pump PMP when the voltage Vps is lower than a threshold Vmin.

Figure 5A:
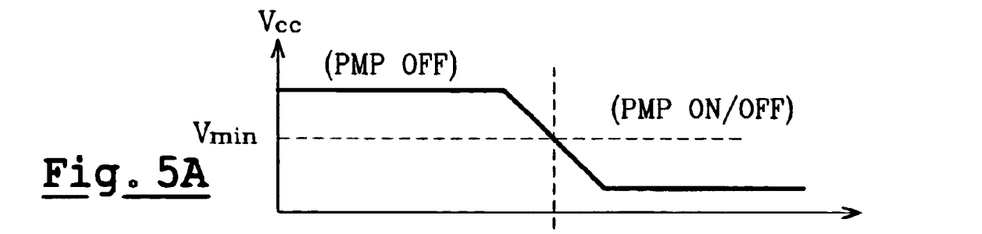
FIGS. 5A and 5B are voltage curves illustrating operation of the power supply management system in FIG. 4.
Figure 5B:
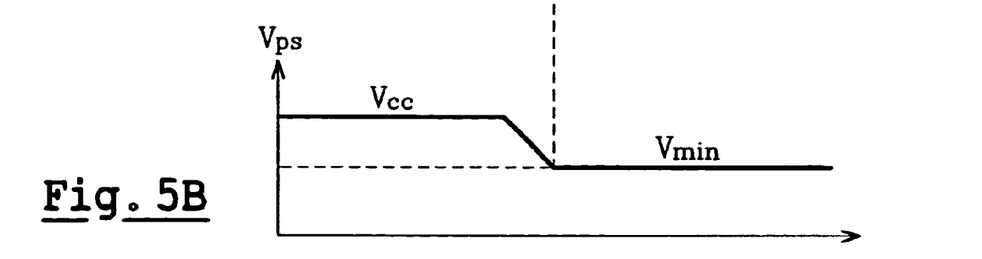

The operation of the circuit PSMC is illustrated by FIGS. 5A and 5B, which respectively represent the voltage Vcc and the voltage Vps. When the voltage Vcc is higher than Vmin, the regulator REG applies the signal OFF to the charge pump PMP that is inactive (PMP OFF), and the superdiode circuit SDC is in the transmission state. The voltage Vps is therefore substantially equal to the voltage Vcc and the charge pump PMP does not, advantageously, consume any current.

If the voltage Vcc drops below Vmin, the regulator activates the charge pump PMP by applying the signal ON. The charge pump then delivers a voltage Vps that is adjusted proximate to the voltage Vmin, by successively starting and stopping the charge pump (PMP ON/OFF) controlled by the regulator REG. The voltage Vps is therefore maintained proximate to the threshold Vmin.

The superdiode circuit avoids triggering the charge pump when the voltage Vcc is within the range of values (Vcc+Vd, Vcc). Vd is the threshold voltage of the diode. The result is a significant save in current consumption when the voltage Vcc is within this range of values.

Figure 6:
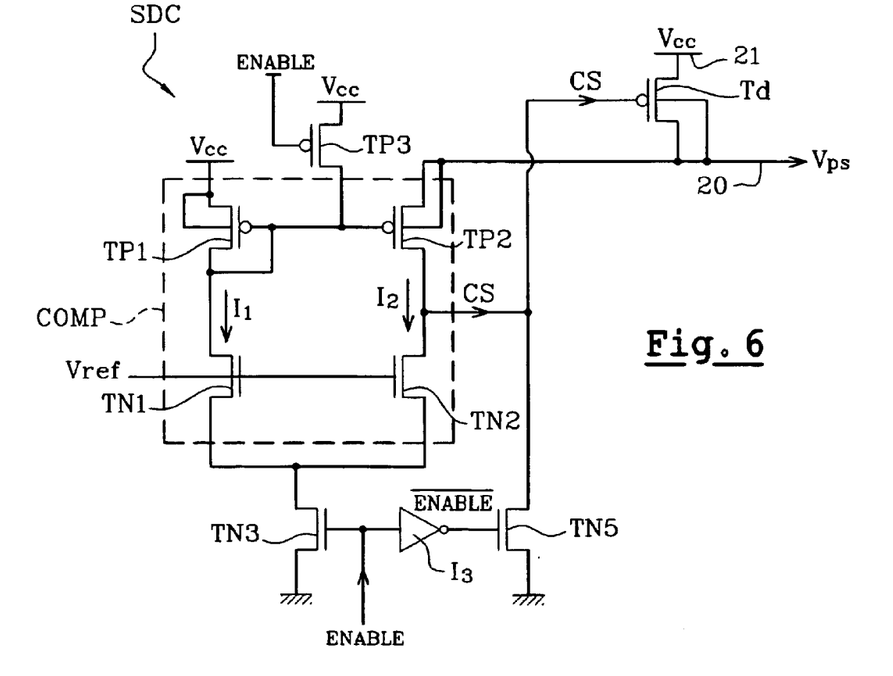
FIG. 6 is a wiring diagram of the superdiode circuit (SDC) represented in block form in FIG. 4.

FIG. 6 represents one embodiment of the superdiode circuit SDC. The circuit SDC mainly comprises a PMOS type transistor Td and the comparator COMP according to the present invention. Here, the source of the transistor TP1 receives the voltage Vcc. The source of the transistor TP2 is linked to the line 20 and receives the voltage Vps. The output signal CS of the comparator is applied to the gate of the transistor Td. The source of the transistor Td is linked to the supply terminal 21, on which the voltage Vcc is located. The drain and the bulk of the transistor Tp are linked to the distribution line 20, on which the voltage Vps is located. When it is on, the transistor Td simulates the superdiode function described above since the series voltage drop at its terminals is very low, and is only due to its source-drain resistance in the forward direction (Rdson).

The circuit SDC comprises, as an option, a transistor TP3 driven by a signal ENABLE, linking the gates of the transistors TP1, TP2 to the voltage Vcc, and a transistor TN3 driven by the signal ENABLE, linking the sources of the transistors TN1, TN2 to the ground. Again as an option, the output node of the comparator, delivering the signal CS, is linked to ground through a transistor TN5. This transistor has its gate driven by an inverted signal /ENABLE delivered by a gate I3.

When the signal ENABLE is equal to 0, the transistor TP3 is on and the transistor TN3 is blocked. The transistors TP1 and TP2 receive the voltage Vcc at their gates and are blocked. The transistor TN5 is on and forces the signal CS to 0, such that the transistor Td is on. The voltage Vps is not controlled and is constantly equal to Vcc.

The circuit SDC is active when the signal ENABLE is equal to 1 (Vcc). The comparator COMP then operates as described above, by replacing V1 by Vcc and V2 by Vps. Therefore, the signal CS changes to 1 (Vps) when the voltage Vps is higher than the voltage Vcc (activation of the charge pump). The change to 1 of the signal CS blocks the transistor Td, which simulates the blocking of a reverse biased diode. Since the switch time of the comparator is rapid, the time during which the voltage Vps boosted by the charge pump is in short-circuit with the voltage Vcc is negligible.

In fact, and as indicated above, the transistor Td controlled by the comparator operates like an ideal virtual diode, by being on when the voltage Vps is proximate to Vcc by lower values, and by being blocked when the voltage Vps rises under the action of the charge pump. The voltage Vcc is in this case lower than Vmin (FIGS. 5A, 5B).

Figure 7:
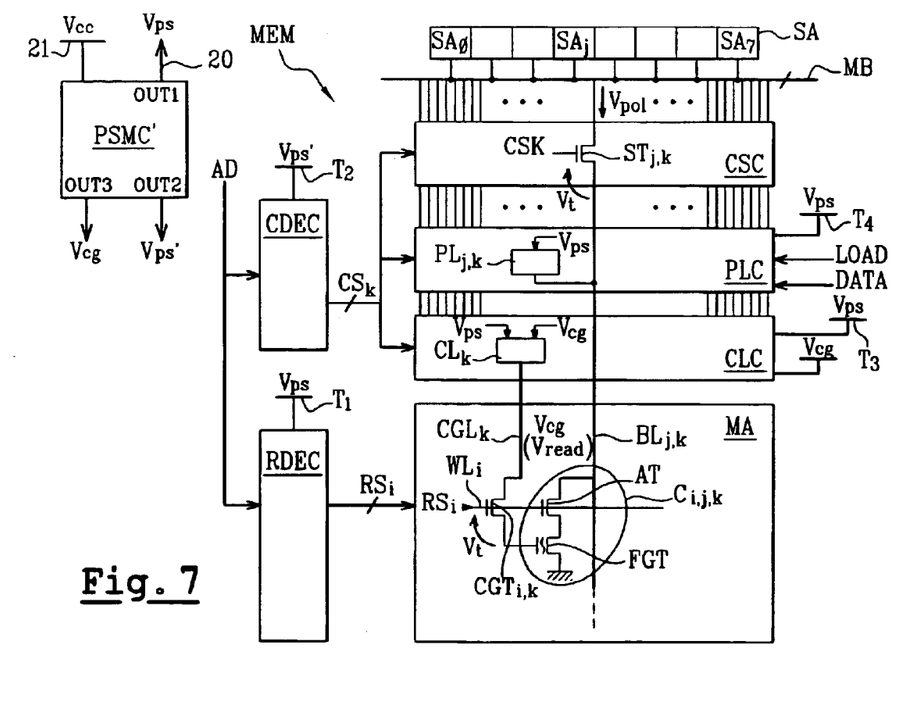
FIG. 7 is a diagram of an electrically erasable and programmable memory comprising a power supply management system according to the present invention.

An application of the present invention to an electrically erasable and programmable memory, or EEPROM memory will now be described. FIG. 7 represents a memory MEM in an integrated circuit, comprising a circuit PSMC' according to the present invention. The memory comprises, like the integrated circuit described above, a distribution line 20 of an internal supply voltage Vps and a supply terminal 21 receiving an external supply voltage Vcc.

The circuit PSMC' has one input linked to the terminal 21 and one output OUT1 linked to the distribution line 20, delivering the voltage Vps. The circuit PSMC' also has one output OUT2 delivering a voltage Vps' and one output OUT3 delivering a gate control voltage Vcg.

The memory MEM has a classical EEPROM memory architecture and comprises a memory array MA wherein memory cells $C_{i,j,k}$ are linked to word lines $WL_i$ and to bit lines $BL_{j,k}$. The bit lines $BL_{j,k}$ are arranged in columns, wherein i is a word line index, k is a column index and j is a bit line index within a column. Each memory cell $C_{i,j,k}$ comprises a floating-gate transistor FGT, the drain of which is linked to a bit line $BL_{j,k}$ through an access transistor AT. The gate of the transistor FGT is linked to a gate control line $CGL_k$ through a gate control transistor $CGT_{i,k}$. The gate of the gate control transistor $CGT_{i,k}$ and the gate of the access transistor AT are connected to a word line $WL_i$.

The memory also comprises a line decoder RDEC, a column decoder CDEC, a column lock circuit CLC, a column selection circuit CSC, a programming circuit PLC and a read circuit SA. The read circuit SA comprises sense amplifiers, here eight amplifiers SA0 to SA7. Each amplifier $SA_j$ of rank j is linked, through a multiplexing bus MB, to the bit lines $BL_{j,k}$ of the same rank j of the memory array.

The line decoder RDEC and the column decoder CDEC respectively receive the most significant bits and the least significant bits of an address AD, and respectively deliver I line selection signals $RS_i$ and K column selection signals $CS_k$. After application of an address AD, a line selection signal $RS_i$ out of the I signals $RS_i$ is set to 1 by the line decoder, while the other signals $RS_i$ are at 0. Similarly, a column selection signal $CS_k$ out of the K signals $CS_k$ is set to 1 by the column decoder while the other signals $CS_k$ are at 0.

The line decoder RDEC comprises a supply terminal T1 receiving the voltage Vps via the line 20. The voltage Vps thus determines the voltage level of a line selection signal RSi set to 1. The column decoder CDEC comprises a supply terminal T2 receiving the voltage Vps' delivered by the output OUT2 of the circuit PSMC'. The voltage Vps' thus determines the voltage level of a column selection signal $CS_k$ at 1.

The column selection circuit CSC comprises bit line selection transistors $ST_{j,k}$. Each transistor $ST_{j,k}$ is arranged in series on a bit line $BL_{j,k}$ and allows the bit line to be connected to a sense amplifier $SA_j$. The transistors $ST_{j,k}$ present on bit lines of the same column are driven by the selection signal $CS_k$ of the column considered.

The column lock circuit CLC comprises column selection locks $CL_k$ and receives the gate control voltage Vcg at one input. Each lock $CL_k$ is activated by a column selection signal $CS_k$ and delivers the voltage Vcg to the gate control line $CGL_k$ of the column to which it is assigned, when it is activated by the corresponding signal $CS_k$.

The programming circuit PLC comprises programming locks $PL_{j,k}$ each having an output linked to a bit line $BL_{j,k}$. The locks $PL_{j,k}$ are activated by the selection signals $CS_k$, to load data [DATA] to be programmed, on the basis of one bit per lock, upon receiving a signal LOAD.

The voltage Vps is applied to a supply terminal T3 of the circuit CLC and to a supply terminal T4 of the circuit PLC, that are connected to the line 20. Such a memory is generally required to have technical specifications that are quite wide and fairly unrestrictive for the user as far as the external supply voltage Vcc is concerned, with a tolerance range from 1.6 V to 5.6 V for example. However, in practice, it emerges that a drop in the voltage Vcc in the lowest values of the tolerance range is capable of leading to a malfunction of the memory when reading.

It will be assumed that a memory cell $C_{i,j,k}$ must be read by an amplifier SAj. A column selection lock $CL_k$ applies the voltage Vcg to the gate control line $CGL_k$. The voltage Vcg is, in this case, equal to a read voltage Vread and must be found, without attenuation, on the gate of the floating-gate transistor FGT, through the transistor $CGT_{i,k}$. The voltage Vread is between the threshold voltage of the erased transistor and the threshold voltage of the programmed transistor, and enables the sense amplifier $SA_j$ to find out whether the transistor is on (transistor erased, corresponding to the reading of a 1) or blocked (transistor programmed, corresponding to the reading of a 0).

It will now be assumed that the voltage Vread is on the order of 1.2 V, as is generally the case, and that the tolerance range for the voltage Vcc is 1.6–5.6 V. So that the voltage Vread reaches, without attenuation, the control gate of the transistor FGT, the gate of the transistor $CGT_{i,k}$ must receive a selection signal $RS_i$ having a voltage level at least equal to Vread+Vt. Vt is the threshold voltage of the transistor $CGT_{i,k}$. As the voltage level of a selection signal $RS_i$ set to 1 is equal to the voltage Vps, the latter must be higher or equal to a threshold Vmin1, such that:

$V\text{min}1 = V\text{read} + Vt,$ i.e., approximately 2.2 V in the above mentioned example. Yet, the threshold Vmin1 is above the lowest values of the voltage Vps contained in the above mentioned tolerance range.

A similar problem is encountered on the bit line $BL_{j,k}$ during the reading of the cell. The sense amplifier $SA_j$ applies a voltage Vpol to the bit line $BL_{j,k}$ that must be found on the drain of the transistor FGT after passing through a selection transistor $ST_{j,k}$ and the access transistor AT. The access transistor AT must therefore receive a selection signal $RS_i$ at its gate that is at least equal to a threshold Vmin2:

$V\text{min}2 = V\text{pol} + Vt,$ wherein Vt is the threshold voltage of the access transistor.

Similarly, the selection transistor $ST_{j,k}$ must receive a selection signal $CS_k$ at its gate that is at least equal to Vmin2, so that the voltage Vcc applied to the decoder CDEC must not be below Vmin2. In fact, providing a wide tolerance range for the supply voltage Vcc implies maintaining the internal supply voltage Vps above the thresholds Vmin1 and Vmin2, and maintaining the voltage Vps' above the threshold Vmin2.

As the voltage Vpol is generally below Vread, such as 1 V for example, the threshold Vmin2 is below the threshold Vmin1. Maintaining a minimum voltage Vmin1 on the decoders RDEC and CDEC is therefore sufficient to provide a proper bias of the gates of the access transistor AT and of the selection transistor $ST_{j,k}$.

Figure 8:
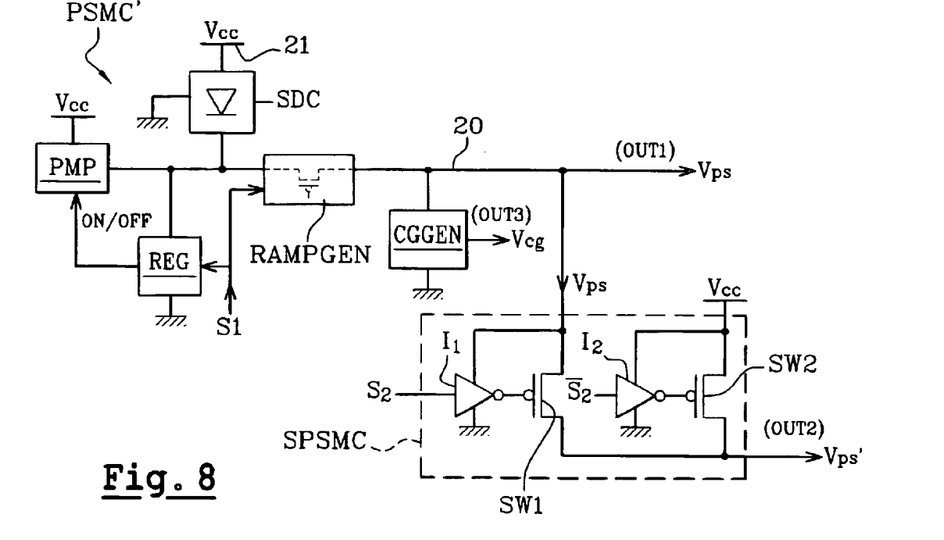
FIG. 8 is a diagram of a second embodiment of the power supply management system in the memory in FIG. 7.

This object is achieved by the circuit PSMC' according to the present invention, represented in greater detail in FIG. 8. The circuit PSMC' has the same elements as the circuit PSMC described above, i.e., a charge pump PMP, a regulator REG and a superdiode circuit SDC according to the present invention. These elements are arranged in the same way.

The voltage Vps' is delivered by a secondary circuit SPSMC present in the circuit PSMC. The output of the circuit SPSMC forms the output OUT2 of the circuit PSMC, and is connected to the terminal T2 of the column decoder CDEC. The circuit SPSMC comprises two switches SW1, SW2 with a low series voltage drop, driven by opposite signals S2 and /S2. The switch SW1 is off when the switch SW2 is on, and vice-versa. The switch SW1 links the line 20 to the output OUT2. The switch SW2 receives the voltage Vcc at one terminal, and its other terminal is connected to the output OUT2. Here, the switches SW1, SW2 are PMOS transistors and the signals S2 and /S2 are applied to their gates through inverting gates I1, I2 respectively supplied by the voltage Vps and the voltage Vcc. The voltage Vps' delivered by the output OUT2 is therefore equal to the voltage Vps or to the voltage Vcc, depending on the value of the signal S2, and disregarding the voltage drop in the switches SW1, SW2.

Finally, the gate control voltage Vcg is delivered by a circuit CGGEN that, in itself, is well known by those skilled in the art, the output of which forms the output OUT3 of the circuit PSMC.

The regulator REG3 has two modes of operation, selected by a signal S1. In the first mode of operation, when S1=0 for example, the regulator REG3 monitors the voltage Vps1 present on the line 20 and activates the charge pump PMP3 when the voltage Vps1 becomes lower than a threshold Vmin. This mode of operation has been described above and is illustrated by FIGS. 5A and 5B. Therefore, when the voltage Vcc is higher than Vmin, the regulator REG applies the signal OFF to the charge pump PMP and the superdiode circuit SDC is in transmission state. The voltage Vps is substantially equal to the voltage Vcc and the charge pump PMP does not, advantageously, consume any current. When the voltage Vcc drops below Vmin, the regulator activates the charge pump PMP that delivers a voltage Vps adjusted proximate to Vmin.

Here the threshold Vmin is chosen to be at least equal if not higher than the highest of the thresholds Vmin1 and Vmin2, below which the voltage Vps1 would be insufficient to provide a smooth operation of the process of reading memory cells.

In the second mode of operation, the regulator REG3 controls the charge pump so that it delivers a high voltage Vpp. The voltage Vpp is gradually applied by a circuit RAMPGEN that is activated by the change to 1 of the signal S1. The circuit RAMPGEN comprises a PMOS control transistor, for example, arranged in series on the line 20, represented by dotted lines and can be considered as transparent from an electrical point of view outside ramp generation periods.

The circuit SPSMC allows the voltage Vps not to be applied to the column decoder CDEC during the periods of erasing/programming, when the voltage Vps is equal to the high voltage Vpp. The signal S2 is then set to 0 and the column decoder is supplied by the voltage Vcc via the switch SW2. Preferably, the signal S2 is set to 1 only during the periods of effective reading of memory cells, when the voltage Vps' must be controlled so as to provide a smooth operation of the reading process. The signal S2 can be left at 0 during periods of loading programming locks, during periods of selecting columns, etc.

TABLE 1 below summarizes operation of the circuit PSMC'. Vcont designates the controlled value of the voltage Vps outside periods of erasing/programming, when the voltage Vps is maintained above the threshold Vmin, as shown in FIG. 5B.

TABLE 1

|  | S1 | S2 | Vcg | Vps | Vps' |
|---|---|---|---|---|---|
| Preparation steps for the writing of a word: |  |  |  |  |  |
| Application of an address, selection of a line and a column, loading a word into programming locks . . . | 0 | 0 | 0 | Vcont | Vcc |
| Writing a word: |  |  |  |  |  |
| Erasing the word line | 1 | 0 | Verase | Vpp | Vcc |
| Programming the word | 1 | 0 | 0 | Vpp | Vcc |
| Preparation steps for the reading of a word: |  |  |  |  |  |
| Application of an address, selection of a line and a column, activation of a column selection lock . . . | 0 | 0 | 0 | Vcont | Vcc |
| Reading a word: |  |  |  |  |  |
| Activation of sense amplifiers and application of the read voltage Vread to the cells | 0 | 1 | Vread | Vcont | Vcont |

During the reading of memory cells, the voltage Vcg is equal to a read voltage Vread that is a fraction of the voltage Vps. During phases of erasing (Vps=Vpp), the voltage Vcg is equal to a high voltage Verase that is a fraction of the voltage Vpp (Verase is on the order of Vpp minus a voltage drop in NMOS transistors). During programming phases, the voltage Vcg delivered by the circuit CGGEN is equal to 0 (ground).

It will be understood by those skilled in the art that different variations and applications of the comparator according to the present invention may be made. Different variations and applications of the power supply management circuit according to the present invention may also be made.

Furthermore, it goes without saying that the power supply management system according to the present invention is independent of the structure of the comparator described above and can be implemented with any type of circuit capable of comparing an external supply voltage and an internal supply voltage, such as a sampling digital circuit.

Figure 9:
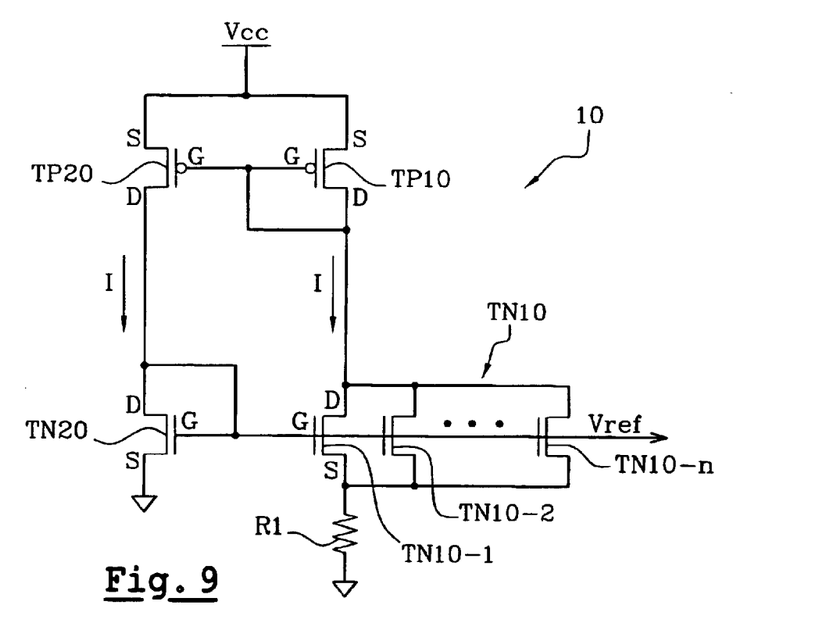
FIG. 9 is a diagram of a reference voltage generator used by the comparator in FIGS. 3 and 6.

FIG. 9 represents a reference voltage generator, of a structure that, in itself, is well known by those skilled in the art. The generator delivers the voltage Vref described above, which is applied to transistors TN1, TN2 of the comparator COMP according to the present invention.

The generator comprises a first branch comprising a PMOS transistor TP10 and an NMOS transistor TN10 in series, and a second branch comprising a PMOS transistor TP20 and an NMOS transistor TN2G in series. The drain of the transistor TN10 is linked to the drain of the transistor TN10, the source of which is linked to ground through a resistance R1. The drain of the transistor TP20 is connected to the drain of the transistor TN20, the source of which is linked to ground. The transistor TN10 has a gate width to length ratio, or W/L ratio, equal to n times that of the transistor TN20, and is generally produced by NMOS transistors TN10-1, TN10-2, . . . TN10-$n$ in parallel, that are identical to the transistor TN20. The transistors TP10, TP20 receive the voltage Vcc at their sources S and are arranged as current mirrors. For example, the gate G of the transistor TP20 is connected to the gate of the transistor TP10 which is itself connected to the drain D of the transistor TP10.

In order to ensure the self-biasing of the generator at a determined point of operation, the gate of the transistor TN10 is connected to the gate of the transistor TN20, which is itself connected to the drain of the transistor TN20. After applying the voltage Vcc, the generator sets itself to a point of operation where the two branches are passed through by the same current I.

The voltage Vref delivered by the generator is taken off, for example, at the gate of the transistor TN10. The application of the voltage Vref at gates of NMOS transistors arranged in branches outside the generator, such as the transistors TN1, TN2 of the comparator according to the present invention for example, allows sources of current to be produced. The voltage Vref imposes a current I=f(Vref) in the external branches. This current is equal to the current I if the external transistors are identical to the transistor TN10, otherwise it is proportional to the current I. The transistors TN1, TN2 controlled by the voltage Vref are therefore the equivalent of current generators inserted into the comparator.

That which is claimed is:

1. A comparator comprising:

first and second inputs for respectively receiving first and second voltages;

first and second PMOS transistors arranged as current mirrors, each PMOS transistor comprising a gate, a source and a drain;

said first PMOS transistor having its source connected to the first input for receiving the first voltage, and said second PMOS transistor having its source connected to the second input for receiving the second voltage;

a first current source connected in series with said first PMOS transistor for defining a first branch of the comparator;

a second current source connected in series with said second PMOS transistor for defining a second branch of the comparator; and an output of the comparator connected between one of the drains of said first and second PMOS transistors and the corresponding first or second current source connected in series therewith for providing an output signal based upon a comparison of the first and second voltages, the output signal having a first value when the second voltage is higher than the first voltage and a second value when the second voltage is lower than the first voltage.

2. A comparator according to claim 1, wherein the gates of said first and second PMOS transistors are connected together.

3. A comparator according to claim 1, wherein said first PMOS transistor has its gate connected to its drain; and wherein the output is connected to the drain of said second PMOS transistor.

4. A comparator according to claim 1, wherein said first and second PMOS transistors each comprise a body, wherein said first PMOS transistor has its body connected to its source, and wherein said second PMOS transistor has its body connected to its source.

5. A comparator according to claim 1, wherein the gates of said first and second PMOS transistors have the same dimensions.

6. A comparator according to claim 1, wherein said first current source comprises a first NMOS transistor comprising a gate, a source and a drain; wherein said second current source comprises a second NMOS transistor comprising a gate, a source and a drain; and wherein the drain of said first PMOS transistor is connected to the drain of said first NMOS transistor; the drain of the second PMOS transistor is connected to the drain of said second NMOS transistor; the gates of said first and second NMOS transistors are connected together for receiving a voltage reference so that the current in the first and second branches are substantially equal or proportional to one another.

7. An integrated circuit comprising:
a terminal for receiving an external supply voltage;
a comparator comprising
first and second inputs for respectively receiving the external supply voltage and an internal supply voltage,
first and second PMOS transistors arranged as current mirrors, each PMOS transistor comprising a gate, a source and a drain,
said first PMOS transistor having its source connected to the first input for receiving a first voltage, and said second PMOS transistor having its source connected to the second input for receiving a second voltage, and
an output of the comparator connected to the drain of one of said first and second PMOS transistors for providing an output signal based upon a comparison of the external and internal supply voltages, the output signal having a first value when the internal supply voltage is higher than the external supply voltage and a second value when the internal supply voltage is lower than the external supply voltage; and
a booster circuit connected to the terminal for receiving the external supply voltage;
a power switch connected to the terminal for receiving the external supply voltage and being driven by the output signal; and
a distribution line for providing the internal supply voltage, said distribution line connected to said booster circuit and to said power switch.

8. An integrated circuit according to claim 7, wherein the gates of said first and second PMOS transistors are connected together.

9. An integrated circuit according to claim 7, wherein said first PMOS transistor has its gate connected to its drain; and wherein the output is connected to the drain of said second PMOS transistor.

10. An integrated circuit according to claim 7, wherein said first and second PMOS transistors each comprise a body, wherein said first PMOS transistor has its body connected to its source, and wherein said second PMOS transistor has its body connected to its source.

11. An integrated circuit according to claim 7, wherein the gates of said first and second PMOS transistors have the same dimensions.

12. An integrated circuit according to claim 7, wherein said comparator further comprises:
a first current source connected in series with said first PMOS transistor for defining a first branch of the comparator; and
a second current source connected in series with said second PMOS transistor for defining a second branch of the comparator.

13. An integrated circuit according to claim 12, wherein said first current source comprises a first NMOS transistor comprising a gate, a source and a drain; wherein said second current source comprises a second NMOS transistor comprising a gate, a source and a drain; and wherein the drain of said first PMOS transistor is connected to the drain of said first NMOS transistor; the drain of the second PMOS transistor is connected to the drain of said second NMOS transistor; the gates of said first and second NMOS transistors are connected together for receiving a voltage reference so that the current in the first and second branches are substantially equal or proportional to one another.

14. An integrated circuit according to claim 7, further comprising a control circuit for activating said booster circuit when the internal supply voltage is lower than a threshold so as to maintain the internal supply voltage close to the threshold when the external supply voltage is too low; said power switch being blocked by said comparator when said at least one booster circuit is active.

15. An integrated circuit according to claim 7, wherein said power switch comprises a PMOS transistor comprising a gate for receiving the output signal.

16. An integrated circuit according to claim 7, wherein said booster circuit comprises a charge pump.

17. An integrated circuit according to claim 14, further comprising:
an array of electrically erasable and programmable memory cells; and
at least one line decoder connected to said distribution line for receiving the internal supply voltage.

18. An integrated circuit according to claim 17, wherein the threshold is higher than or equal to a sum of a memory cell read voltage and a MOS transistor threshold voltage.

19. An integrated circuit according to claim 17, further comprising a regulator connected to said booster circuit and to said distribution line, said regulator having two modes of operation for performing the following:
taking the internal supply voltage to a high erasing or programming voltage during phases of erasing or programming memory cells; and
maintaining the internal supply voltage close to the threshold when the external supply voltage is too low, at least during phases of reading memory cells.

20. A memory comprising:
an array of memory cells; and
a power supply management circuit connected to said array of memory cells for providing an internal supply voltage and comprising
a charge pump connected to an external supply voltage,
a distribution line connected to said charge pump and providing the internal supply voltage,
a diode circuit connected between said distribution line and the external supply voltage, said diode circuit comprising a comparator comprising
first and second inputs for respectively receiving the external supply voltage and the internal supply voltage, first and second PMOS transistors arranged as current mirrors, each PMOS transistor comprising a gate, a source and, a drain, said first PMOS transistor having its source connected to the first input for receiving the external supply voltage, and said second PMOS transistor having its source connected to the second input for receiving the internal supply voltage, and an output of the compartor connected to the drain of said second PMOS transistors for providing an output signal based upon a comparison of the external and internal supply voltages, the output signal having a first value when the internal supply voltage is higher than the external supply voltage and a second value when the internal supply voltage is lower than the external supply voltage, said diode circuit being blocked when the external supply voltage is too low.

21. A memory according to claim 20, wherein the gates of said first and second PMOS transistors are connected together.

22. A memory according to claim 20, wherein said first PMOS transistor has its gate connected to its drain.

23. A memory according to claim 20, wherein said comparator further comprises:

a first current source connected in series with said first PMOS transistor for defining a first branch of the comparator; and a second current source connected in series with said second PMOS transistor for defining a second branch of the comparator.

24. A memory according to claim 23, wherein said first current source comprises a first NMOS transistor comprising a gate, a source and a drain; wherein said second current source comprises a second NMOS transistor comprising a gate, a source and a drain; and wherein the drain of said first PMOS transistor is connected to the drain of said first NMOS transistor; the drain of the second PMOS transistor is connected to the drain of said second NMOS transistor; the gates of said first and second NMOS transistors are connected together for receiving a voltage reference so that the current in the first and second branches are substantially equal or proportional to one another.

25. A memory according to claim 24, wherein said power supply management circuit further comprises a power switch connected to the external supply voltage and being driven by the output signal.

26. A memory according to claim 25, wherein said power supply management circuit further comprises an activation circuit for activating said charge pump when the internal supply voltage is lower than a threshold so as to maintain the internal supply voltage close to the threshold when the external supply voltage is too low; said power switch being blocked by said comparator when said charge pump is active.

27. A memory according to claim 26, in said power supply management circuit further comprises a regulator connected to said charge pump and to said distribution line, said regulator having two modes of operation for performing the following:

taking the internal supply voltage to a high erasing or programming voltage during phases of erasing or programming memory cells; and maintaining the internal supply voltage close to the threshold when the external supply voltage is too low, at least during phases of reading memory cells.

28. A method for making a comparator comprising:

connecting a first PMOS transistor to a first input, and connecting a second PMOS transistors to a second input, the first and second PMOS transistor being connected together as current mirrors, each PMOS transistor comprising a gate, a source and a drain;

the first PMOS transistor having its source connected to the first input for receiving the first voltage, and the second PMOS transistor having its source connected to the second input for receiving the second voltage;

connecting a first current source in series with the first PMOS transistor for defining a first branch of the comparator;

connecting a second current source in series with the second PMOS transistor for defining a second branch of the comparator; and forming an output of the comparator connected between the drain of one of the first and second PMOS transistors and the corresponding first or second current source connected in series therewith for providing an output signal based upon a comparison of the first and second voltages, the output signal having a first value when the second voltage is higher than the first voltage and a second value when the second voltage is lower than the first voltage.

29. A method according to claim 28, further comprising connecting the gate and the drain of the first PMOS transistor together; and wherein the output is connected to the drain of the second PMOS transistor.

30. A method according to claim 28, wherein the gates of the first and second PMOS transistors have the same dimensions.

31. A method according to claim 28, wherein the first current source comprises a first NMOS transistor comprising a gate, a source and a drain; wherein the second current source comprises a second NMOS transistor comprising a gate, a source and a drain; and further comprising:

connecting the drain of the first PMOS transistor to the drain of the first NMOS transistor;

connecting the drain of the second PMOS transistor to the drain of the second NMOS transistor; and connecting the gates of the first and second NMOS transistors together for receiving a voltage reference so that the current in the first and second branches are substantially equal or proportional to one another.

* * * * *

UNITED STATES PATENT AND TRADEMARK OFFICE
CERTIFICATE OF CORRECTION

PATENT NO. : 6,812,747 B2
APPLICATION NO. : 10/420342
DATED : November 2, 2004
INVENTOR(S) : Fillipe Ganivet et al.

It is certified that error appears in the above-identified patent and that said Letters Patent is hereby corrected as shown below:

Column 10, line 44, after "as" insert --a--

Column 10, line 45, "mirrors" should be --mirror--

Column 11, line 31, after "as" insert --a--

Column 11, line 32, "mirrors" should be --mirror--

Column 13, line 1, after "as" insert --a--

Column 13, line 2, "mirrors" should be --mirror--

Column 13, line 9, "compartor" should be --comparator--

Column 14, line 14, after "as" insert --a--

Column 14, line 14, "mirrors" should be --mirror--

Signed and Sealed this

Twenty-second Day of September, 2009

David J. Kappos
*Director of the United States Patent and Trademark Office*